United States Patent [19]

Caruso et al.

[11] 4,131,484
[45] Dec. 26, 1978

[54] FREQUENCY ADJUSTING A PIEZOELECTRIC DEVICE BY LASERING

[75] Inventors: Robert D. Caruso, Salem, N.H.; Gerald A. Setter, Jr., West Seneca, N.Y.

[73] Assignee: Western Electric Company, Inc., New York, N.Y.

[21] Appl. No.: 877,541

[22] Filed: Feb. 13, 1978

[51] Int. Cl.$^2$ .................... B08B 7/02; B23K 31/10; H04R 17/10
[52] U.S. Cl. ........................ 134/1; 29/25.35; 29/593; 219/121 LM
[58] Field of Search .................. 134/1; 29/25.35, 593; 310/328; 219/121 LM

[56] References Cited
U.S. PATENT DOCUMENTS

| | | | |
|---|---|---|---|
| 3,653,253 | 4/1972 | Olin | 310/328 X |
| 3,928,063 | 12/1975 | King, Jr. et al. | 134/1 |

OTHER PUBLICATIONS

Hokanson, et al., "Laser -Machining . . .," *Journal of Applied Physics*, vol. 40, No. 3, Jul. 1969, pp. 3157-3160.
Nonaka, et al., "The Current Dependency . . .," *Proceedings of the 25th Annual Symposium on Frequency Control*, Apr. 1971, pp. 139-147.

*Primary Examiner*—Richard V. Fisher
*Attorney, Agent, or Firm*—D. D. Bosben

[57] ABSTRACT

Electrode material is laser machined from a piezoelectric device (10) to adjust its resonant frequency to a nominal value. At the same time the device (10) is electronically cleaned by overdriving the device at a high current level to prevent loosely adhering lasered particles, which cause the device to be electrically unstable, from accumulating on the device. The simultaneous laser machining and electronic cleaning also eliminates erratic resonant frequency changes in the device (10) which occur if the electronic cleaning is performed after the laser machining. As the nominal resonant frequency value is approached, the device (10) is overdriven at successively lower current levels and the laser machining is carried out at respective successively lower rates.

10 Claims, 8 Drawing Figures

FREQUENCY ADJUSTING A PIEZOELECTRIC DEVICE BY LASERING

FIELD OF THE INVENTION

This invention relates to a method of adjusting the resonant frequency of a piezoelectric device by lasering, and more specifically to a method of adjusting the resonant frequency of a piezoelectric crystal device wherein the device is electronically cleaned by overdriving the device at a high current level in comparison to its normal operating current level as electrode material is laser machined from the device to change its resonant frequency to a nominal value.

DESCRIPTION OF THE PRIOR ART

The adjusting of the resonant frequency of a baseplated quartz crystal device, such as a quartz crystal resonator, downward to a nominal value by the use of sequential nickel electroplating ("rough adjust") and gold vaporization ("fine tuning") steps is a slow, time consuming process. The nickel electroplating step also requires the use of electroplating equipment which is difficult to maintain and the gold vaporization step requires the use of bulky vacuum deposition equipment.

An article entitled "Laser-Machining Thin-Film Electrode Arrays on Quartz Crystal Substrates," by J. L. Hokanson et al, published in the Journal of Applied Physics, Volume 40, No. 3, July 1, 1969, pages 3157–3160, discloses a system for the laser machining of electrodes of a baseplated quartz crystal device to adjust its frequency upward to a nominal value, whereby the above-mentioned nickel electroplating and gold vaporization steps can be eliminated. However, while the laser machining system as described in this article is suitable for adjusting the frequency of various quartz crystal devices, such as resonators or monolithic crystal filters, the system is not particularly suited for this purpose where the required change in frequency during the adjustment process is on the order of or greater than 500 Hz. Under these conditions it has been found that the lasering operation creates a significant accumulation of loosely adhering lasered particles on the device being adjusted. When the device is subsequently energized these particles tend to move about, changing the electrical parameters (effective resistance, insertion loss and resonant frequency) of the device and making it unstable in operation.

An article entitled "The Current Dependency of Crystal Unit Resistance at Low Drive Level," by S. Nonaka et al., published in the Proceedings of the 25th Annual Symposium on Frequency Control, April, 1971, pages 139–147, discloses what is known in the art as an "electronic" cleaning process in which the resistance of a quartz crystal device having small metal (e.g., gold) particles sticking to the device can be reduced by overdriving the device at a high current level to remove the metal particles. Electronic cleaning of a quartz crystal device to remove debris from the device also is disclosed in the W. H. King, Jr. et al. patent No. 3,928,063 and the J. G. Olin patent No. 3,653,253. It has been found, however, that electronic cleaning of a quartz crystal device after the above-mentioned lasering operation by overdriving the device at a high current level in an attempt to stabilize the device produces erratic changes in the resonant frequency of the device.

SUMMARY OF THE INVENTION

In general, this invention relates to a method of adjusting the resonant frequency of a piezoelectric device which comprises the step of laser machining electrode material from the device to change its resonant frequency to a nominal value. The piezoelectric device is simultaneously overdriven at a high current level in comparison to its normal operating current level, to prevent lasered particles, which cause the device to be electrically unstable in subsequent operation, from accumulating on the device. The simultaneous lasering and electronic cleaning of the device also eliminates erratic resonant frequency changes which are produced when the device is electronically cleaned after the lasering operation.

More specifically, initially the piezoelectric device may be overdriven at a current level on the order of at least thirty times its normal operating current level with a current flow in the device of at least sixty milliamps. Then, as the resonant frequency of the piezoelectric device nears the nominal value, the device is sequentially driven at successively lower current levels to reduce distortion in the resonant frequency response of the device and to obtain improved definition of a resonant frequency curve being continuously displayed on a monitor. At the same time a drive signal, which is being applied to the piezoelectric device at different frequencies in a first step size over a range extending below and above the nominal resonant frequency, is applied to the device at different frequencies in a decreased step size to produce a frequency curve display over a narrowed frequency range on the monitor. As the current drive levels are sequentially reduced to successively lower levels (whereby the electronic cleaning action produced thereby also is reduced), the rate at which the device is lasered also is reduced to respective successively lower levels.

DETAILED DESCRIPTION

Figure 1:
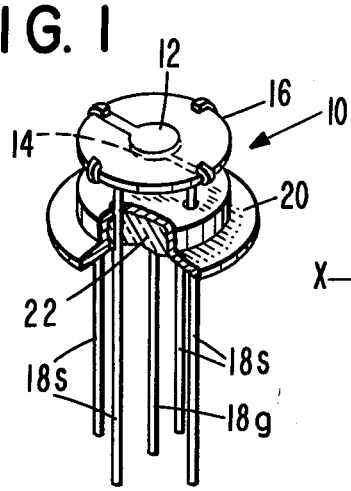
FIG. 1 is an isometric view of a quartz crystal resonator which may be adjusted as to resonant frequency in accordance with this invention.

Referring to FIG. 1, a quartz crystal resonator 10 of a known type which may be adjusted to a nominal resonant frequency Fn (FIGS. 4, 5 and 6) in accordance with the disclosed embodiment of the invention has outer and inner circular electrodes 12 and 14 of a suitable contact metal, such as gold, vapor deposited or otherwise plated on opposite sides of a circular AT-cut quartz crystal body or wafer 16 in superimposed relationship. The wafer 16 is fixedly mounted on four support leads 18s, two of which are electrically "active" and connected to respective ones of the electrodes 12 and 14, and two of which are electrically "inactive." The resonator 10 also includes a ground lead 18g secured to and extending from a cylindrical cap-shaped metal header 20. The leads 18s extend through apertures in the metal header 20 with portions of the leads embedded in a glass insulating material 22 in the header. After the resonator 10 has been adjusted to resonant frequency, the wafer 16 is enclosed by a protective cover (not shown) which is crimped to the metal header 20 in a known manner.

As is known in the art, a high frequency potential applied across the electrodes 12 and 14 of the quartz crystal resonator 10 will piezoelectrically generate thickness shear mode vibrations in the crystal wafer 16 at a resonant frequency dependent upon various factors, such as the size and mass of the electrodes, and the diameter and thickness of the wafer. In this connection, the size and mass of the electrodes 12 and 14, and the diameter and thickness of the crystal wafer 16, are selected to produce a desired resonant frequency using empirical data generated by measuring a plurality of sample parts in a manner known to those skilled in the art. By way of illustration, in one of the quartz crystal resonators 10 having a nominal resonant frequency Fn (FIGS. 4, 5 and 6) on the order of 3.15 MHz, the crystal wafer 16 may have a diameter of 590 mils and a thickness of 20 mils, and the electrodes 12 and 14 each may have a diameter of 236 mils and a thickness of 23,000 A°.

In carrying out the subject invention, the electrodes 12 and 14 of the quartz crystal resonators 10 initially are formed on the crystal wafer 16 in a known manner. Each of the resonators 10 which then has a resonant frequency below the desired nominal value Fn (FIGS. 4, 5 and 6) within a preselected practical lower limit, then is adjusted to the nominal value Fn by lasering parallel lines of spaced holes 12h (FIG. 2) in the outer electrode 12, thereby causing the resonant frequency of the resonator to increase to the nominal value. At the same time, the quartz crystal resonator 10 is driven at a high current level in comparison to its normal operating current level to prevent loosely adhering lasered particles, which cause the resonator to be electrically unstable in subsequent operation, from accumulating on the resonator as a result of the lasering operation.

Figure 2:
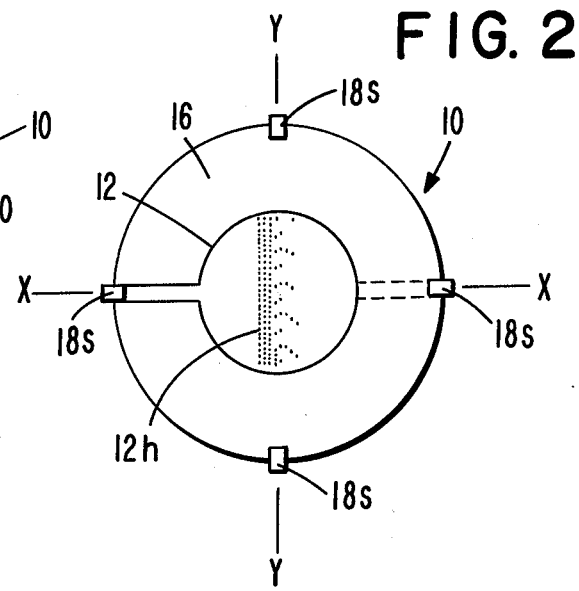
FIG. 2 is a partial plan view of the quartz crystal resonator of FIG. 1, illustrating a pattern in which electrode material may be lasered from the device in accordance with this invention.
Figure 3:
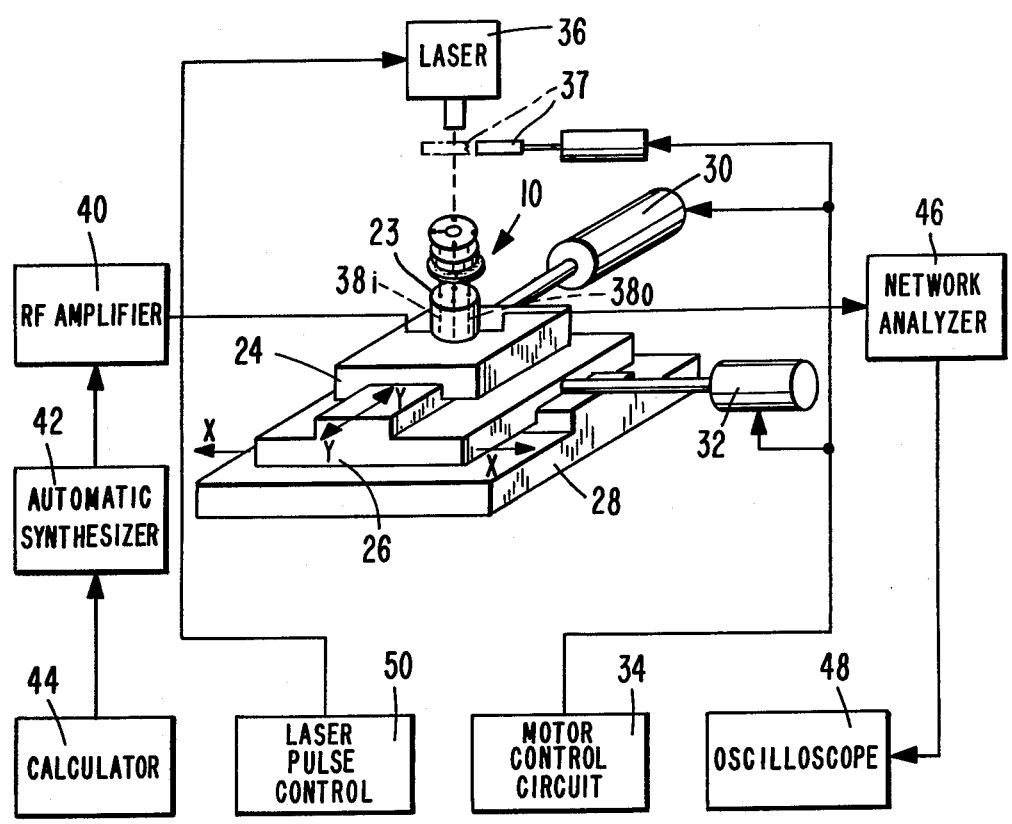
FIG. 3 is a schematic block diagram of a system for adjusting the resonant frequency of the quartz crystal resonator shown in FIG. 1.

Referring to FIG. 3, in a resonant frequency adjusting operation the leads 18s, 18g (FIG. 1) of the quartz crystal resonator 10 are inserted in a contact pin-type electrical socket 23 mounted on a first carriage 24. The first carriage 24 is slidably mounted on a second carriage 26 for reciprocable movement along a Y-axis, and the second carriage is slidably mounted on a base member 28 for reciprocable movement along a X-axis. The carriages are driven by respective reversible stepping motors 30 and 32 under the direction of a control circuit 34 to move the resonator 10 in Y and X directions in sequence relative to a beam of a pulsed laser 36 for vaporizing the holes 12h (FIG. 2) in the outer electrode 12.

In this connection, at the beginning of each frequency adjusting operation the beam of the laser 36 is blocked by a reciprocable shutter 37. Upon actuation of a start contact (e.g., a foot pedal control switch, not shown) in the motor control circuit 34, the shutter 37 is moved from an advanced beam blocking position as shown in dashed lines in FIG. 3, to a retracted nonblocking position as shown in solid lines in this figure. At the same time, the first carriage 24 and the resonator 10 initially are driven in a Y direction by the first motor 30.

By way of illustration, as viewed in FIG. 2, during this movement of the resonator 10 the laser 36 (FIG. 3) may form the left-hand line of the holes 12h in the outer electrode 12, beginning at the upper end of the line. As the carriage 24 and the resonator 10 reach the end of their traverse in the Y direction, the first motor 30 is temporarily de-energized and the second motor 32 is energized to index the carriages 24 and 26, and thus the resonator 10, a small distance (e.g., 4–6 mils) to the left in FIGS. 2 and 3, whereupon the second motor is de-energized and the first motor is energized in a reverse direction. The first motor 30 then moves the carriage 24 and the resonator 10 in a reverse direction parallel to the Y axis so that the laser 36 forms a second line of the holes 12h in the outer electrode 12. This traversing and indexing procedure is continued, with the lasering rate being successively reduced as is subsequently described herein, until the resonator 10 has been adjusted to the desired nominal resonant frequency Fn. In this connection, it is to be understood that more or less lines of the lasered holes 12h may have to be formed in the electrode 12 in any particular instance.

The pulsed laser 36 may be of any suitable type capable of being focused to produce a beam which will heat, melt and evaporate the metal of the outer electrode 12 to form the holes 12h therein to a small diameter, such as one mil, without causing any significant disruption to the physical integrity of the crystal wafer 16. For example, favorable results have been achieved with a neodymium-doped yttrium aluminum garnet (Nd:YAG) laser having a wavelength of 1.06 microns, such as the Model 601 laser available from the Quantronix Corporation of Smithtown, New York.

The electrical socket 23 includes an input contact pin 38i which is connected to the output of a RF amplifier 40. The RF amplifier 40, which may be of any suitable type, preferably has an output capacity so that it is capable of initially driving the quartz crystal resonator 10 at a current level on the order of 30–35 times its normal operating current level. (While higher current drive levels may be used, too high a drive level may cause disintegration of the electrodes 12 and 14). By way of illustration, where the resonator 10 has the above-mentioned nominal resonant frequency Fn on the order of 3.15 MHz, and a normal operating current level of 2 milliamps, favorable results have been achieved with an initial current drive level on the order of 60–70 milliamps, using a RF amplifier having a gain on the order of 47 db and an output capacity of 10–12 watts, such as the Model 805 RF amplifier available from the RF Communications Company of Rochester, New York.

Figure 4:
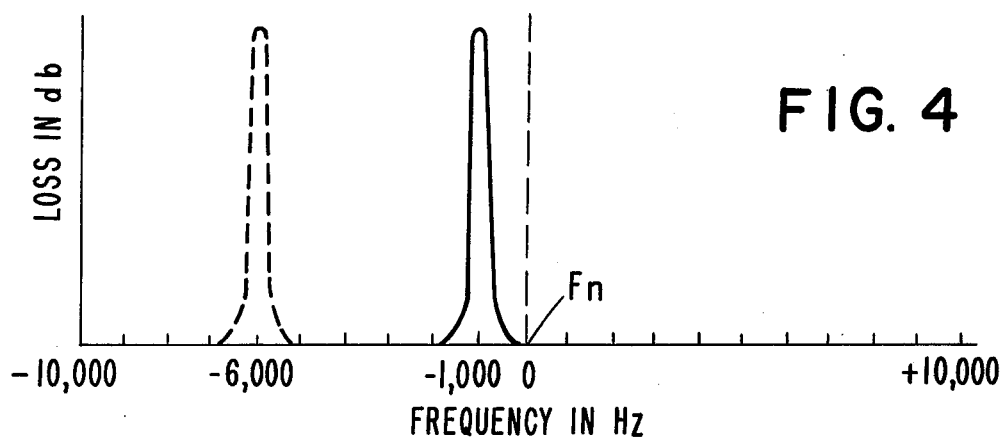
FIG. 4 is a graph illustrating resonant frequency curves of a quartz crystal resonator as shown in FIG. 1, obtained with the system of FIG. 3 in a first adjusting phase in accordance with the invention.
Figure 5:
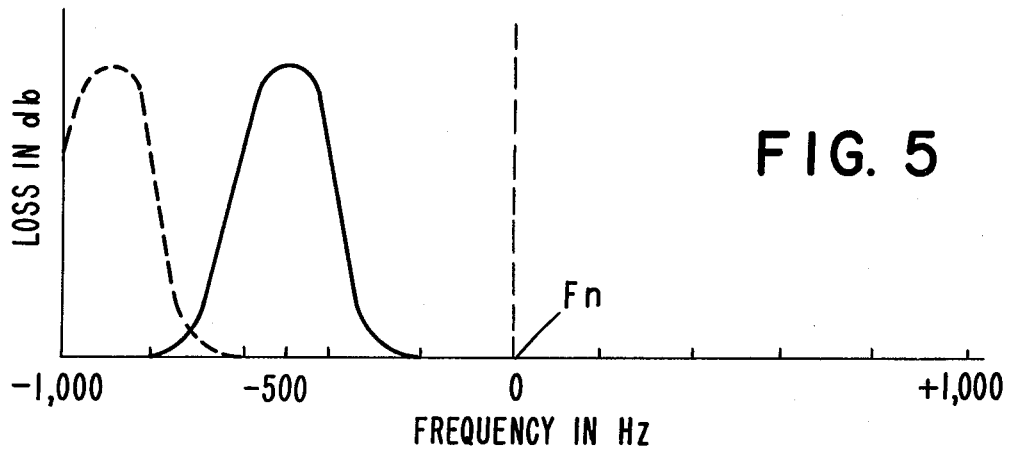
FIG. 5 is a graph illustrating resonant frequency curves of a quartz crystal resonator as shown in FIG. 1, obtained with the system of FIG. 3 in a second adjusting phase in accordance with the invention.
Figure 6:
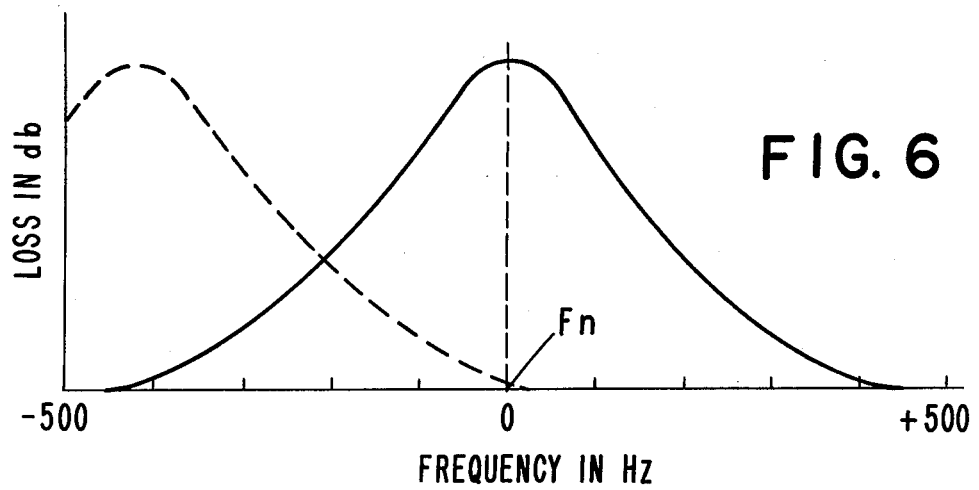
FIG. 6 is a graph illustrating resonant frequency curves of a quartz crystal resonator as shown in FIG. 1, obtained with the system of FIG. 3 in a third adjusting phase in accordance with the invention.

The RF amplifier 40 may be fed by any suitable power source capable of producing output signals of different desired power levels and at different frequencies below and above the desired nominal resonant frequency value Fn (FIGS. 4, 5 and 6). By way of illustration, in the disclosed embodiment of the invention the RF amplifier 40 is fed by an automatic synthesizer 42 connected to a suitably programmed calculator 44. The synthesizer 42 and the calculator 44 may be the ASCII system available from the Hewlett-Packard Company of Palo Alto, California as their Model 300B synthesizer and their Model 9820 calculator. In this system the synthesizer 42 produces output signals of different power levels and at different frequencies in variable frequency step sizes in response to signals from the calculator 44, which includes a microprocessor. In this connection, in carrying out the subject invention the calculator 44 is programmed so as to cause the synthesizer 42 to produce output signals of different desired output levels and at different frequencies in variable frequency step sizes automatically in response to the actuation of a "program run" button (not shown) of the calculator.

The electrical socket 23 also includes an output contact pin 38o which is connected to a network analyzer 46 capable of measuring the resonant frequency of the quartz crystal resonator 10, and feeding a resultant signal to a monitor in the form of an oscilloscope 48. The network analyzer 46 and the oscilloscope 48 may be, by way of example, the Model 3570A network analyzer and the Model 1201B oscilloscope of the Hewlett-Packard Company. The output contact pin 38o is connected to the network analyzer 46 through a suitable load resistance (not shown) for the RF amplifier 40, and also is connected to ground through a small resistance (not shown) to develop a voltage potential which can be measured by the network analyzer and displayed on a screen of the oscilloscope 48 in the form of a resonant frequency curve in a known manner.

Preferably, each of the quartz crystal resonators 10 is positioned in the electrical socket 23 with the socket 23 located in a "load-unload" position (not shown) displaced from the beam of the laser 36. The resonator 10 then is indexed into its lasering position as shown in FIG. 3 in a known manner. For example, the motor control circuit 34 may include circuitry (not shown) which, in cooperation with an optical positioning system (not shown) associated with the carriages 24 and 26, drives the motors 30 and 32 to locate the resonator in its lasering position. Closure of a laser shield or door (also not shown) then causes energization of the laser 36, with the beam of the laser being blocked from striking the resonator outer electrode 12 by the shutter 37.

After the quartz crystal resonator 10 has been located in its lasering position, the "program run" button (not shown) of the programmed calculator 44 is actuated by the operator. The calculator 44 then causes the synthesizer 42 to step to the highest drive level and the largest frequency step size for which it has been programmed. In this connection, in accordance with the subject invention the calculator 44 causes the synthesizer 42 to produce an output signal which drives the resonator 10 through the RF amplifier 40 at a high current level, such as on the order of 30-35 times the normal operating current level of the resonator, as noted hereinabove. At the same time, referring to FIG. 4, the calculator 44 causes the synthesizer 42 to produce its output signal at different successively increasing frequencies, beginning at a level below the nominal resonant frequency Fn and in frequency steps of relatively large size so as to encompass an initial relatively wide frequency range on opposite sides of the nominal resonant frequency.

By way of illustration, the initial resonant frequency curve display on the screen of the oscilloscope 48 may be over a frequency range such as 10,000 Hz on each side of the desired nominal resonant frequency value Fn, as illustrated in FIG. 4. Thus, since the aforementioned synthesizer 42 produces 100 frequency steps in each scan cycle of the oscilloscope 48, to obtain the desired 20,000 cycle range the synthesizer is programmed to produce a drive signal at successively increasing frequencies in steps of 200 cycles (i.e., 20,000 ÷ 100).

Referring to FIG. 4, as the RF amplifier 40 and the synthesizer 42 drive the quartz crystal resonator 10 as above described, a resonant frequency curve for the resonator is displayed on the screen of the oscilloscope 48, as is illustrated, for example, by the dashed line curve in this figure. The operator then determines visually from the displayed resonant frequency curve the value of the resonant frequency of the resonator 10, and takes action accordingly.

For example, if the resonant frequency of the quartz crystal resonator 10 is below the above-mentioned preselected practical lower limit (e.g., more than 6,000 Hz below the nominal resonant frequency Fn for the above-described 3.15 MHz resonator), whereby it may be difficult to adjust the resonator to the nominal value Fn and still maintain other electrical parameters (e.g., effective resistance and insertion loss) to acceptable values, the resonator preferably is removed from the apparatus without being adjusted and is replaced with another resonator. Similarly, if the resonant frequency of the resonator 10 exceeds the nominal value Fn, the resonator is removed from the apparatus for adjustment to the nominal value in a separate process in which additional electrode material is plated on the resonator.

If the resonant frequency of the quartz crystal resonator 10 is at a value within the preselected practical lower limit, a control knob (not shown) of a laser pulse control unit 50 (FIG. 3) is set by the operator to cause lasering of the outer electrode 12 (FIGS. 1 and 2) at a rate depending upon the magnitude of the frequency adjustment which is necessary to reach the nominal value Fn. By way of illustration, assuming that the resonant frequency of the resonator 10 is within a preselected lower frequency range (e.g., −1,000 Hz to −6,000 Hz of the nominal value Fn for the above-described 3.15 MHz resonator) as illustrated by the dashed line curve in FIG. 4, the pulse rate of the laser 36 initially is set so that the laser produces the holes 12h (FIG. 2) in the outer electrode 12 of the resonator on a relatively close spacing, such as four mils.

The above-mentioned start contact (not shown) in the motor control circuit 34 then is closed to cause retraction of the laser beam shutter 37 and energization of the motor 30 to drive the carriage 24 in a Y direction as above described. Then, as the laser 36 begins to form the first left-hand line of the spaced holes 12h in the outer electrode 12 of the resonator 10 as viewed in FIG. 2, the resonant frequency of the resonator increases and the resonant frequency curve displayed on the screen of the oscilloscope 48 moves toward the center of the screen, as illustrated by the solid line curve in FIG. 4.

During the initial resonant frequency adjusting phase as above described, the resonant frequency curve being displayed on the oscilloscope 48 tends to be distorted as a result of the quartz crystal resonator 10 being overdriven at the high current level, whereby the curve is misrepresentative of the actual resonant frequency of the resonator. Further, since the frequency curve is being displayed over a wide frequency range, it is difficult (if not impossible) to make an accurate visual determination as to when the peak of the frequency curve is at the desired nominal resonant frequency value Fn.

Accordingly, referring to the solid line curve in FIG. 4, when the operator observes that the peak of the resonant frequency curve has reached the upper limit (e.g., −1,000 Hz) of the preselected lower frequency range, the operator presses the "program run" button (not shown) of the programmed calculator 44. The calculator 44 then causes the synthesizer 42 to drive the quartz crystal resonator 10 at a lower second current level, such as on the order of twenty times its normal operating current level, to reduce distortion in the resonant frequency response of the resonator and to obtain improved definition of the frequency curve being displayed on the oscilloscope 48. Simultaneously therewith, the calculator 44 causes the synthesizer 42 to produce its output signal in successively increasing frequencies, but in smaller steps, such as 20 Hz, to provide a resonant frequency display on the oscilloscope over a narrower intermediate frequency range, such as ±1,000 Hz, as illustrated in FIG. 5.

Reducing the current drive level of the resonator 10 as above described causes a corresponding reduction in the electronic cleaning action on the outer electrode 12. Accordingly, and in order to retain better control over the adjusting process as the nominal resonant frequency Fn is approached, the operator also adjusts the laser pulse control unit 50 to reduce the pulse rate of the laser 36 so that the beam of the laser now forms the holes 12h in the outer electrode 12 at an increased spacing as illustrated in FIG. 2, thereby reducing the rate at which the electrode is being lasered and the amount of electronic cleaning of the electrode which is required.

As a result of reducing the current level at which the quartz crystal resonator 10 is being driven, and decreasing the frequency step size of the signal being produced by the synthesizer 42, a resonant frequency curve of improved definition is displayed on the left-hand side of the screen of the oscilloscope 48, as illustrated by the dashed line curve in FIG. 5. Then, as the lasering of the outer electrode 12 of the resonator 10 continues, the resonant frequency of the resonator continues to increase and the displayed resonant frequency curve moves to the right in FIG. 5 toward the center of the oscilloscope screen, as illustrated by the solid line curve in FIG. 5.

When the operator observes that the peak of the frequency curve being displayed on the screen of the oscilloscope 48 has reached a position approximately one-half way between the left-hand side and the center of the screen, such as within 500 Hz of the desired nominal resonant frequency value Fn, as illustrated by the solid line curve in FIG. 5, the operator again presses the "program run" button (not shown) of the programmed calculator 44. The calculator 44 now causes the synthesizer 42 to drive the quartz crystal resonator 10 at a still lower current level, such as on the order of 8–10 times the normal operating current level of the resonator, to further reduce distortion in the resonant frequency response of the resonator, and to further improve the definition of the resonant frequency curve on the oscilloscope screen. At the same time, the calculator 44 causes the synthesizer 42 to produce its output signal at frequencies in smaller frequency steps (e.g., 10 Hz), to provide a resonant frequency curve display on the screen of the oscilloscope 48 over a narrower upper frequency range, (e.g., ±500 Hz), as illustrated in FIG. 6.

The operator now also again adjusts the laser pulse control unit 50 to further reduce the pulse rate of the laser 36 so that the laser beam forms the holes 12h in the outer electrode 12 of the quartz crystal resonator 10 at a further increased spacing, as illustrated in FIG. 2. Thus, the electronic cleaning of the resonator outer electrode 12 required as a result of the lasering operation is reduced, thereby again compensating for the fact that the reduction in drive level of the resonator 10 has caused reduced electronic cleaning action of the outer electrode.

The additional reduction in the current drive level of the quartz resonator 10 and the decrease in frequency step size of the signal being produced by the synthesizer 42 now causes a resonant frequency curve of further improved definition to appear on the screen of the oscilloscope 48, as indicated by the dashed line curve at the left-hand side of FIG. 6. As the lasering of the outer electrode 12 of the resonator 10 then continues, the resonant frequency of the resonator continues to increase to the nominal value Fn and the frequency curve moves to the right in FIG. 6 to the center of the oscilloscope screen, as illustrated by the solid line in this figure.

When the peak of the resonant frequency curve reaches its solid line position (i.e., the nominal value Fn) in FIG. 6, the operator opens the above-mentioned start contact (not shown) in the motor control circuit 34, whereupon the shutter 37 is advanced back into blocking relationship with the beam of the laser 36, and the carriage motors 30 and 32 are temporarily de-energized. The motor control circuit 34, upon actuation of an "unload" switch (not shown) thereof, then causes drive motors 30 and 32 to drive the carriages 24 and 26 to their above-mentioned "load-unload" position (not shown). The operator then opens the above-mentioned laser shield or door (not shown), causing de-energization of the laser 36, removes the adjusted quartz crystal resonator 10 from the electrical socket 23, and inserts another resonator in the socket for the next frequency adjusting operation.

In adjusting each of the quartz crystal resonators 10 as above described, it is apparent that where the initial resonant frequency of the resonator is already within the intermediate frequency range (FIG. 5), the initial adjusting phase (FIG. 4) is unnecessary and may be omitted. In such an instance, the operator proceeds directly into the second adjusting phase as above described. Similarly, where the initial resonant frequency of the resonator 10 is already within the upper frequency range (FIG. 6), the first two adjusting phases (FIGS. 4 and 5) are omitted and the operator proceeds directly into the third adjusting phase as above described.

Figure 7:
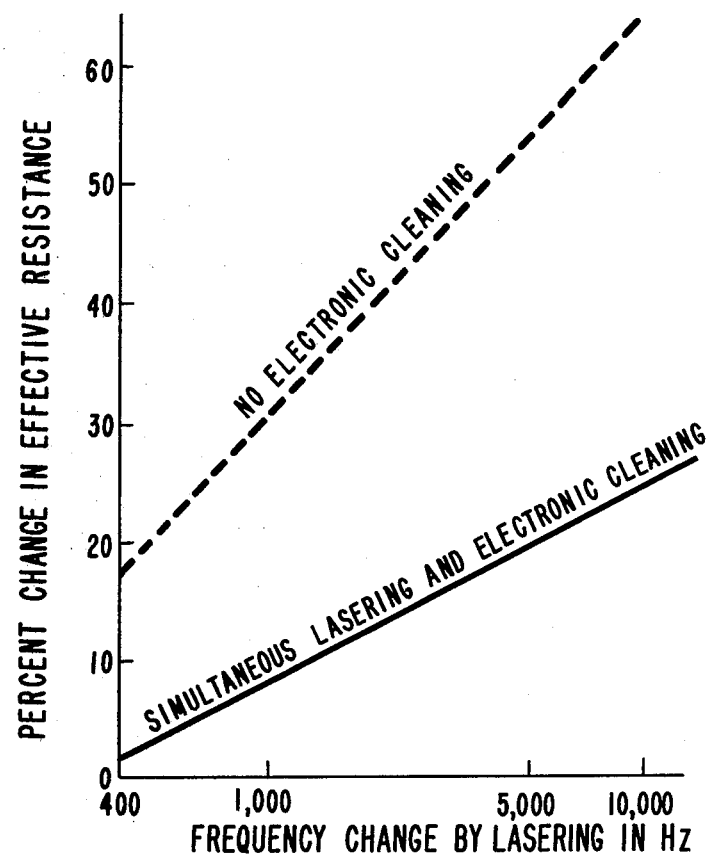
FIG. 7 is a graph illustrating changes in effective resistance of a quartz crystal resonator as shown in FIG. 1, when the resonator is subjected to simultaneous lasering and electronic cleaning in accordance with the invention, and lasering without electronic cleaning, respectively.

FIG. 7 illustrates, on a semilogarithmic scale, the percent change in effective resistance for two sample lots of the quartz crystal resonators 10 having the above-mentioned nominal resonant frequency Fn (FIGS. 4, 5 and 6) on the order of 3.15 MHz, plotted against the amount of resonant frequency change produced in the resonators by lasering of electrode material from the resonators. In this regard, the solid and dashed lines in FIG. 7 represent, respectively, average effective resistance values for the two sample lots of the resonators 10 obtained by drawing the lines through arrays of plotted data points (not shown) for the two sample lots in a known manner.

It is seen from FIG. 7 that in a first sample lot of the quartz crystal resonators 10 which were simultaneously lasered and electronically cleaned in accordance with this invention, average effective resistance, as represented by the solid line, increased on the order of 2% at a resonant frequency change of 400 Hz due to lasering, to on the order of 25% at a resonant frequency change of 10,000 Hz due to lasering. In contrast, the average effective resistance of a second sample lot of the resonators 10 which were lasered without being simultaneously electronically cleaned, as represented by the dashed line, increased on the order of 17% at a resonant frequency change of 400 Hz due to lasering, to on the order of 64% at a resonant frequency change of 10,000 Hz due to lasering.

The increase in effective resistance of the first sample lot of the quartz crystal resonators 10, which were simultaneously lasered and electronically cleaned in accordance with this invention, is attributed to be primarily an inherent result of removing electrode material from the resonators. Similarly, a comparable portion of the increase in effective resistance of the second sample lot of the resonators 10, which were not electronically cleaned during the lasering operation, is considered to have occurred for the same reason. The difference in effective resistance between the two sample lots of the resonators 10 is attributed to the accumulation of loosely adhering lasered particles on the resonators which were not electronically cleaned during the lasering operation. While the higher effective resistance of the latter resonators 10 is not necessarily unacceptable, since the lasered particles tend to move about when the resonators are subsequently energized, the resonators will be electrically unstable in operation unless they are electronically cleaned in a separate step to remove the particles therefrom.

Figure 8:
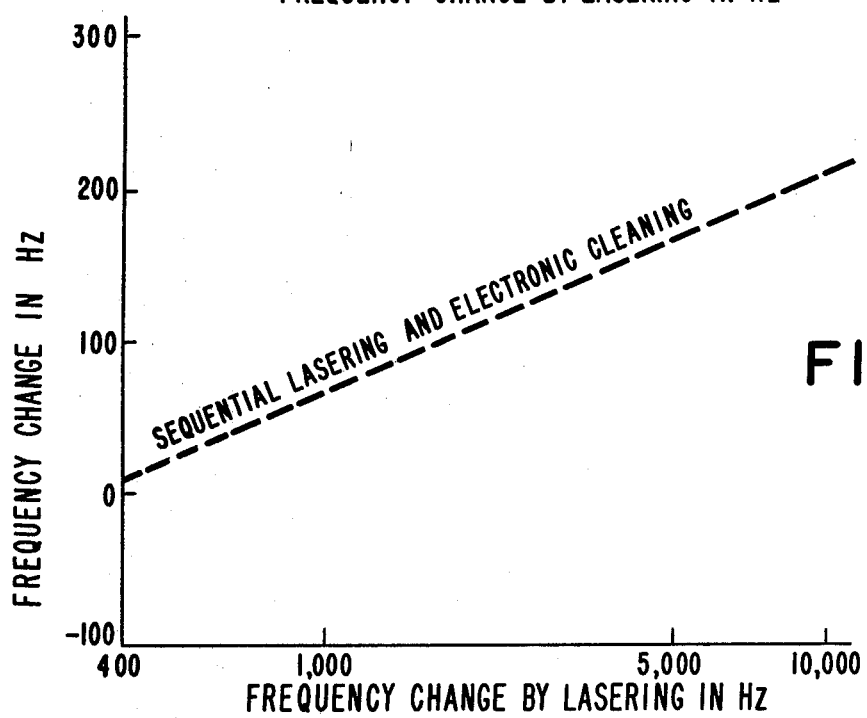
FIG. 8 is a graph illustrating changes in resonant frequency of a quartz crystal resonator as shown in FIG. 1, when the resonator is subjected to sequential lasering and electronic cleaning.

However, FIG. 8 further illustrates on a semilogarithmic scale, that when the second lot of the quartz crystal resonators 10 was subsequently electronically cleaned to remove the lasered particles and restore the resonators to a stable state (with an accompanying reduction in their effective resistance), the resonators experienced an increase in resonant frequency as the change in resonant frequency which had been produced by the lasering operation increased. More specifically, the average resonant frequency of the resonators 10, as represented by the dashed line in FIG. 8 (obtained in the same manner as the lines in FIG. 7), increased from on the order of 8 Hz for a 400 Hz increase in resonant frequency in lasering, to on the order of 200 Hz for a resonant frequency increase of 10,000 Hz by lasering. Further, the actual change in resonant frequency was erratic, with the resonators 10 experiencing a resonant frequency change over a range from a minimum increase of 4 Hz at a 400 Hz increase in resonant frequency by lasering, to a maximum increase of 470 Hz (not shown) at a 4,150 Hz increase in resonant frequency by lasering.

Accordingly, for the second sample lot of the quartz crystal resonators 10 processed by lasering followed by electronic cleaning, where the change in resonant frequency due to lasering exceeded 500 Hz the advantage of the fine tuning the resonators to resonant frequency by lasering was negated by the subsequent electronic cleaning of the resonators to restore their electrical stability. In contrast, the first sample lot of the resonators 10 (solid line in FIG. 7) processed by simultaneous lasering and electronic cleaning in accordance with this invention had final resonant frequency values to within 30 Hz (0.001%) of the nominal value Fn.

While in the disclosed embodiment of the invention each of the quartz crystal resonators 10 is positioned on the carriage assembly 24, 26, which then is driven by the motors 30 and 32 relative to the beam of the laser 36 during the lasering operation, it is contemplated that each resonator could be retained in a fixed position during the frequency adjusting operation and the laser beam then moved relative to the resonators by a suitable mirror system. Further, while in the disclosed embodiment of the invention the changing of the current drive level which is applied to the resonators 10, the change in the frequency step size of the signal which is displayed on the oscilloscope 48, and the changing of the pulse rate of the laser 36, are shown as being accomplished semiautomatically, it is contemplated that these changes could be effected automatically utilizing suitably programmed apparatus for this purpose.

INDUSTRIAL APPLICATION

In summary, a method has been dislcosed for adjusting the resonant frequency of a piezoelectric crystal device, such as the quartz crystal resonator 10, to a nominal value Fn with a high degree of accuracy. This is accomplished by lasering electrode material from the outer electrode 12 of the resonator 10 while simultaneously electronically cleaning the resonator by overdriving the resonator at a high current level in comparison to the current level at which the resonator is normally operated. As a result, an unacceptable accumulation of lasered particles on the resonator 10 during the lasering operation, and a subsequent unacceptable change in the resonant frequency of the resonator as the resonator is electronically cleaned to remove the lasered particles, are eliminated.

More specifically, as the nominal resonant frequency value Fn of the resonator 10 is approached, the resonator is sequentially driven at successively lower current levels in order to reduce distortion of the resonant frequency response of the resonator and to obtain improved definition of the frequency curve being continuously displayed on the oscilloscope 48, as illustrated in FIGS. 4, 5 and 6. When the current drive level is reduced, the frequency step size of the signal being applied to the resonator 10 also is decreased to obtain a resonant frequency curve display on the oscilloscope 48 over a narrowed frequency range, as shown in FIGS. 5 and 6. Further as the current levels at which the resonator 10 is driven are reduced, the lasering of electrode material from the resonator 10 also is reduced to respective successively lower rates. Thus, as the electronic cleaning action produced by driving the resonator 10 at a high current level is reduced, the necessity for electronic cleaning action also is reduced.

What is claimed is:

1. A method of adjusting the resonant frequency of a piezoelectric device, which comprises:

laser machining electrode material from the piezoelectric device to change the resonant frequency of the device to a nominal value; and simultaneously electronically cleaning the piezoelectric device by overdriving the device at a high current level in comparison to the current level at which the device normally is operated, to prevent lasered particles which cause electrical instability of the device in subsequent operation from accumulating on the device.

2. The method as recited in claim 1, in which:

the piezoelectric device is overdriven at a current level on the order of at least thirty times the normal operating current level of the device.

3. The method as recited in claim 1, in which:

the piezoelectric device is overdriven so as to produce a current flow of at least sixty milliamps in the device.

4. The method as recited in claim 1, in which:

the resonant frequency change in the piezoelectric device due to lasering is on the order of at least 500 Hz.

5. The method as recited in claim 1, which further comprises:

reducing the current level at which the piezoelectric device is overdriven as the resonant frequency of the device nears the nominal value, to reduce distortion in the resonant frequency response of the device.

6. The method as recited in claim 5, which further comprises:

reducing the rate at which the electrode material is laser machined from the piezoelectric device as the resonant frequency of the device nears the nominal value.

7. The method as recited in claim 6, in which:

the current level at which the piezoelectric device is overdriven and the rate at which electrode material is laser machined from the piezoelectric device are reduced in sequential steps.

8. The method as recited in claim 1, which further comprises:

continuously displaying a curve representative of the resonant frequency of the piezoelectric device on a monitor; and reducing the current level at which the piezoelectric device is overdriven as the resonant frequency of the device nears the nominal value, to reduce distortion in the resonant frequency response of the device and to obtain improved definition of the resonant frequency curve on the monitor.

9. The method as recited in claim 8, which further comprises:

initially overdriving the piezoelectric device at different frequencies in a first frequency step size over a frequency range extending below and above the nominal resonant frequency; and then overdriving the piezoelectric device at different frequencies in a reduced frequency step size upon reducing the current level at which the device is being overdriven, to produce a frequency curve display on the monitor over a narrower frequency range extending below and above the nominal resonant frequency.

10. A method of adjusting the resonant frequency of a piezoelectric device, which comprises:

laser machining electrode material from the piezoelectric device to change the resonant frequency of the device to a nominal value;

simultaneously with the laser machining of electrode material from the piezoelectric device, electronically cleaning the piezoelectric device by overdriving the device at a high current level in comparison to the current level at which the device is normally operated, to prevent lasered particles which cause electrical instability of the device in subsequent operation from accumulating on the device;

reducing the current level at which the piezoelectric device is overdriven in sequential steps as the resonant frequency of the device nears the nominal value, to reduce distortion in the resonant frequency response of the device; and simultaneously with each reducing of the current level at which the piezoelectric device is overdriven, reducing the rate at which the electrode material is laser machined from the device.

* * * * *